(12) United States Patent
Lee et al.

(10) Patent No.: US 9,721,805 B1
(45) Date of Patent: Aug. 1, 2017

(54) FORMATION METHOD OF SEMICONDUCTOR DEVICE STRUCTURE

(71) Applicant: Taiwan Semiconductor Manufacturing Co., Ltd., Hsinchu (TW)

(72) Inventors: Chia-Hui Lee, Kaohsiung (TW); Chen-Wei Pan, Zhubei (TW); Yi-Wei Chiu, Kaohsiung (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/223,933

(22) Filed: Jul. 29, 2016

(51) Int. Cl.
| | |
|---|---|
| *H01L 21/76* | (2006.01) |
| *H01L 21/8238* | (2006.01) |
| *H01L 21/311* | (2006.01) |
| *H01L 29/78* | (2006.01) |
| *H01L 21/8234* | (2006.01) |

(Continued)

(52) U.S. Cl.
CPC ...... *H01L 21/311* (2013.01); *H01L 21/02129* (2013.01); *H01L 21/02362* (2013.01); *H01L 21/02579* (2013.01); *H01L 21/265* (2013.01); *H01L 21/3115* (2013.01); *H01L 21/31053* (2013.01); *H01L 21/31111* (2013.01); *H01L 21/31155* (2013.01); *H01L 21/823431* (2013.01); *H01L 21/823481* (2013.01); *H01L 21/823821* (2013.01); *H01L 21/823878* (2013.01); *H01L 21/845* (2013.01); *H01L 29/0649* (2013.01); *H01L 29/7851* (2013.01)

(58) Field of Classification Search
CPC .......... H01L 29/7851; H01L 21/31053; H01L 21/265; H01L 21/823481; H01L 21/823878; H01L 29/0649; H01L 21/02129; H01L 21/3115; H01L 21/823821; H01L 21/823431; H01L 29/66795; H01L 21/02579; H01L 21/31155; H01L 21/02362; H01L 21/31051; H01L 21/02576; H01L 21/311; H01L 21/02112
USPC ................................ 438/294, 231, 433, 558
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |

(Continued)

*Primary Examiner* — Shouxiang Hu
(74) *Attorney, Agent, or Firm* — Birch, Stewart, Kolasch & Birch, LLP

(57) ABSTRACT

Structures and formation methods of a semiconductor device structure are provided. The method includes forming first and second fin structures over a semiconductor substrate. Each of the first and second fin structures has an upper portion and a lower portion. The method also includes forming a phosphosilicate glass (PSG) layer surrounding the upper and lower portions of the first fin structure. The method further includes doping the PSG layer to form a doped PSG layer. In addition, the method includes forming a borosilicate glass (BSG) layer surrounding the upper and lower portions of the second fin structure. The BSG layer extends over the doped PSG layer. The method also includes forming an isolation layer over the BSG layer. The method further includes partially etching the isolation layer, the BSG layer and the doped PSG layer to expose the upper portions of the first and second fin structures.

20 Claims, 7 Drawing Sheets

(51) Int. Cl.
    *H01L 21/02*     (2006.01)
    *H01L 21/3115*     (2006.01)
    *H01L 21/3105*     (2006.01)
    *H01L 21/265*     (2006.01)
    *H01L 29/06*     (2006.01)
    *H01L 21/84*     (2006.01)

(56) References Cited

U.S. PATENT DOCUMENTS

| | | | |
|---|---|---|---|
| 7,955,928 B2 * | 6/2011 | Chan | H01L 21/823821 |
| | | | 257/E21.468 |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,883,597 B2 * | 11/2014 | Chang | H01L 21/823807 |
| | | | 257/365 |
| 9,105,490 B2 | 8/2015 | Wang et al. | |
| 9,406,546 B2 * | 8/2016 | Tsai | H01L 21/76224 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0044829 A1 * | 2/2015 | Kim | H01L 21/823807 |
| | | | 438/199 |

\* cited by examiner

FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
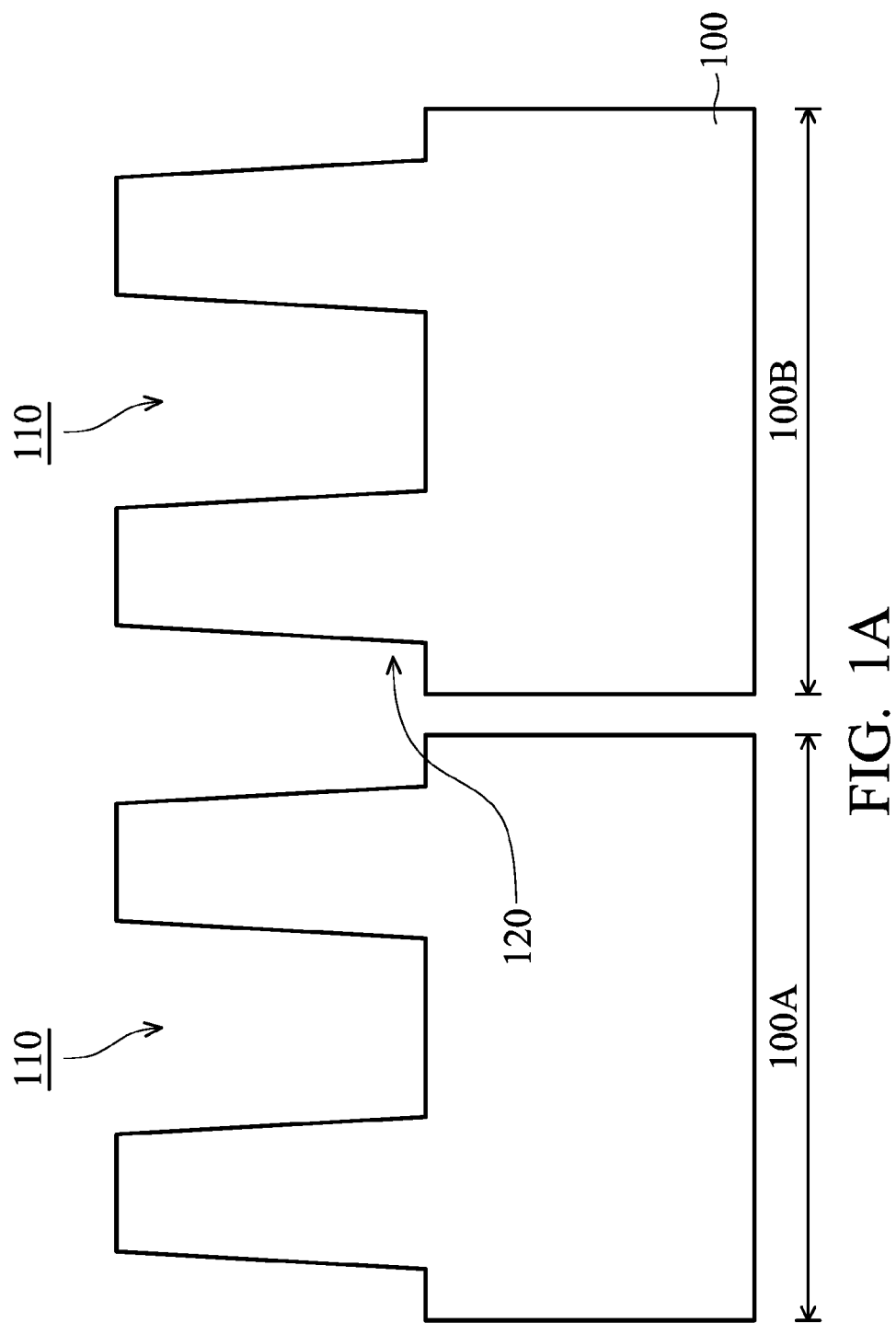
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

The semiconductor substrate 100 is divided into multiple regions 100A and 100B, in accordance with some embodiments. In some embodiments, an N-type fin field-effect transistor (FinFET) is configured to be formed in the region 100A and a P-type FinFET is configured to be formed in the region 100B. In some other embodiments, a P-type FinFET is configured to be formed in the region 100A and an N-type FinFET is configured to be formed in the region 100B. Embodiments of the disclosure are not limited thereto. In some embodiments, N-type or P-type FinFETs are configured to be formed in the regions 100A and 100B.

As shown in FIG. 1A, multiple recesses (or trenches) 110 are formed in the semiconductor substrate 100, in accordance with some embodiments. As a result, multiple fin structures 120 are formed between the recesses 110. In some embodiments, one or more photolithography and etching processes are used to form the recesses 110.

Figure 1B:
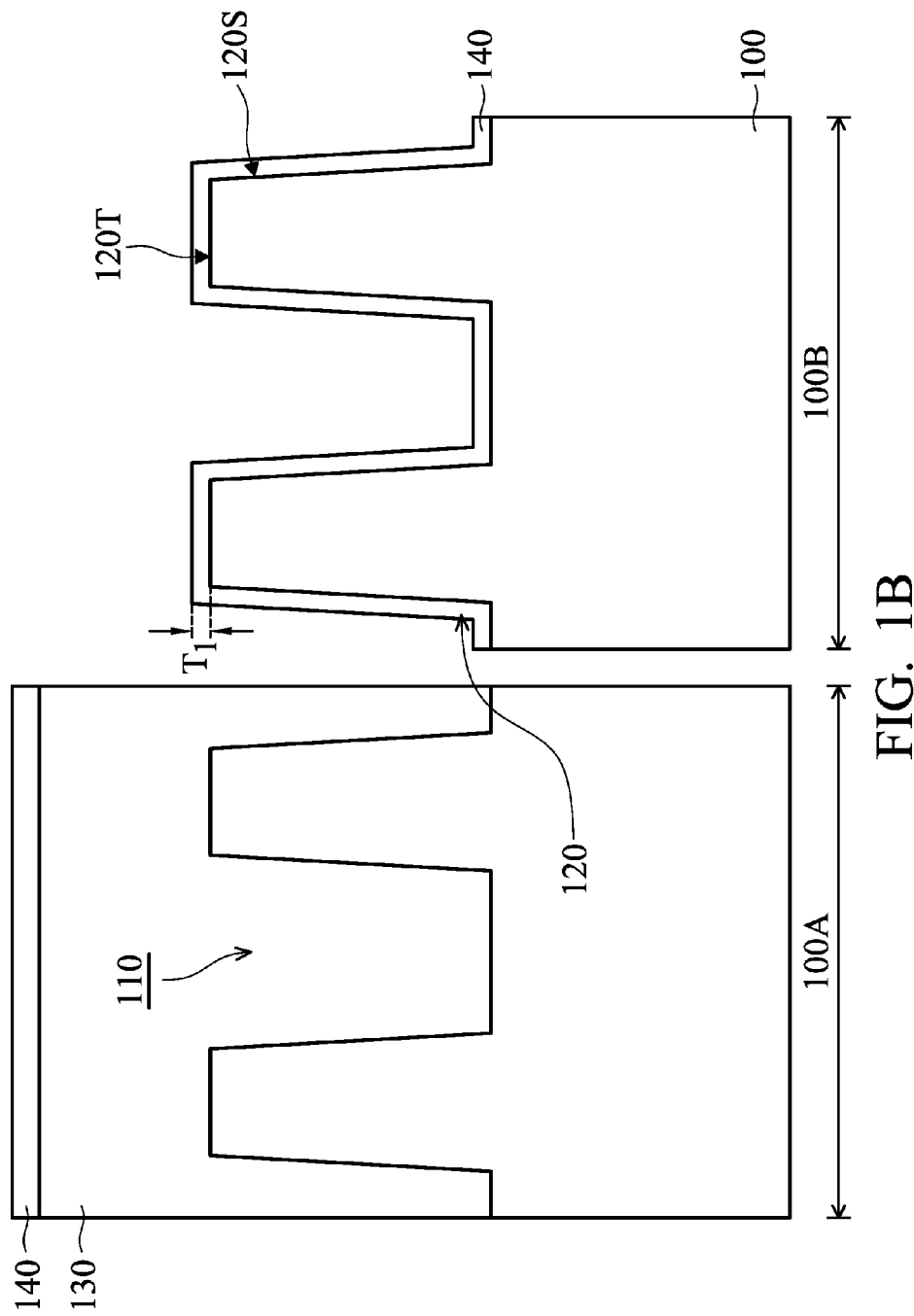

As shown in FIG. 1B, a mask layer 130 is formed over the semiconductor substrate 100, in accordance with some embodiments. The recesses 110 in the region 100A are filled with the mask layer 130. The fin structures 120 in the region 100A are covered by the mask layer 130. The fin structures 120 in the region 100B are exposed by the mask layer 130.

In some embodiments, the mask layer 130 is made of a photoresist material. The photoresist material may include a positive photoresist material or a negative photoresist material. In some embodiments, a mask material layer is deposited over the semiconductor substrate 100 in the regions 100A and 100B. Afterwards, the mask material layer is patterned by one or more photolithography processes. As a result, the mask layer 130 is formed.

Afterwards, a dielectric layer 140 is deposited over the semiconductor substrate 100 and the fin structures 120, as shown in FIG. 1B in accordance with some embodiments. The dielectric layer 140 covers the fin structures 120 in the region 100B. The dielectric layer 140 also covers the mask layer 130 in the region 100A. In some embodiments, the dielectric layer 140 conformally extends over the top surface 120T and the sidewalls 120S of the fin structures 120 in the region 100B. The dielectric layer 140 also extends over the bottom surface 110B of the recesses 110 in the region 100B. In some embodiments, the thickness $T_1$ of the dielectric layer 140 is in a range from about 1 nm to about 3 nm.

In some embodiments, a P-type FinFET is configured to be formed in the region 100B, and the dielectric layer 140 includes a material containing an N-type dopant. The N-type dopant is phosphorus (P), arsenic (As), antimony (Sb) or another suitable dopant. For example, the dielectric layer 140 includes P doped silicon glass, such as phosphosilicate glass (PSG), or another suitable material.

In some embodiments, the dielectric layer 140 is deposited using a CVD process, an atomic layer deposition (ALD) process, a thermal oxidation process, a physical vapor deposition (PVD) process, another applicable process, or a combination thereof.

Afterwards, the mask layer 130 in the region 100A is removed. The dielectric layer 140 over the mask layer 130 in the region 100A is also removed. The mask layer 130 may be removed by an etching process or another applicable process.

Figure 1C:
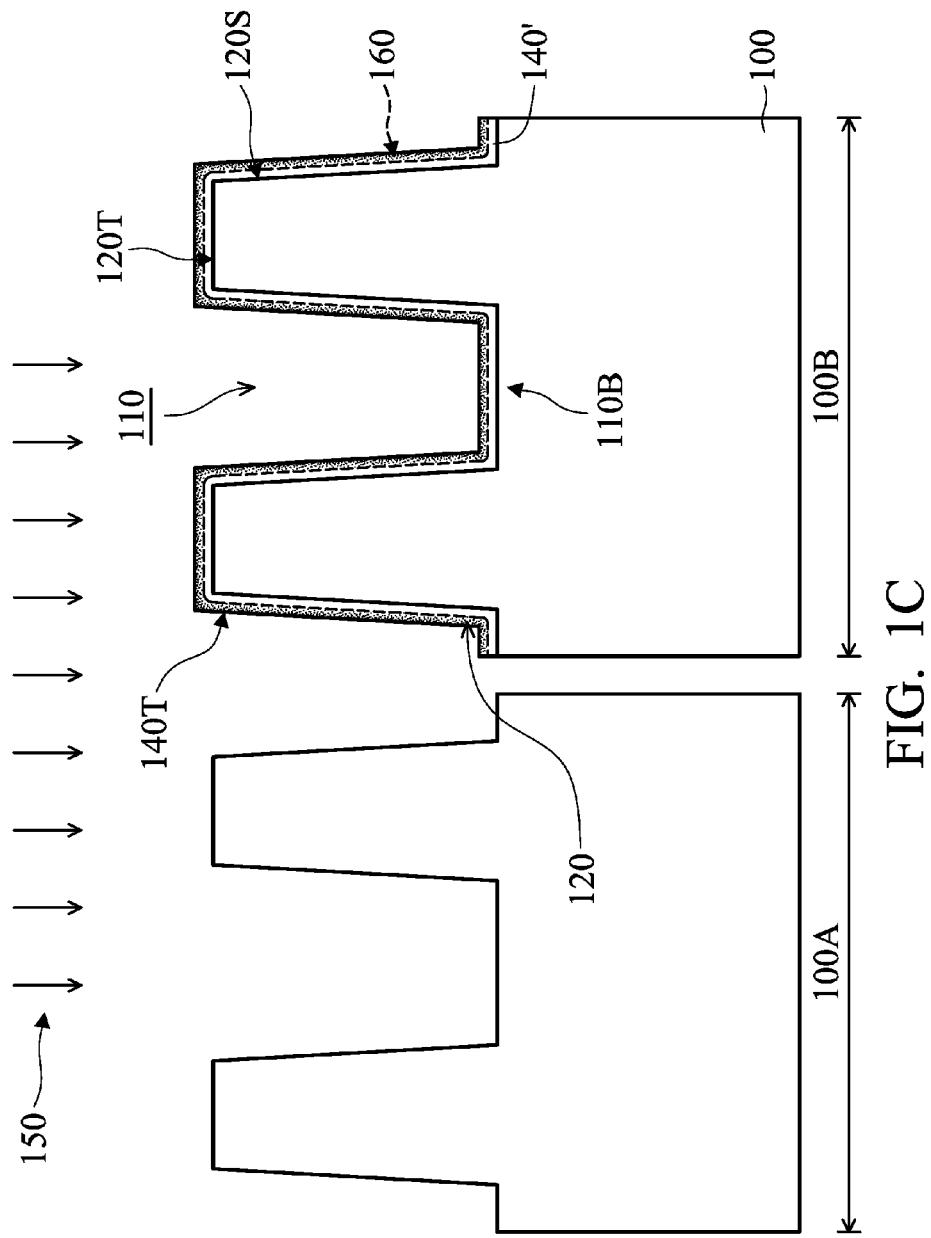

Subsequently, a densification process 150 is performed over the dielectric layer 140 in the region 100B, in accordance with some embodiments. As a result, a densified dielectric layer 140' is formed, as shown in FIG. 1C.

In some embodiments, the densification process 150 includes a doping process. Accordingly, the densified dielectric layer 140' is referred to as a doped dielectric layer. The doping process may be an implantation process. The doping process may or may not be performed at a tilted angle. In some embodiments, an implantation mask layer (not shown) is used to assist in the densification process 150.

In some embodiments, some surface portions of the dielectric layer 140 are doped with an inert dopant during the densification process 150. In some embodiments, the concentration of the inert dopants in the densified dielectric layer 140' gradually becomes lower along a direction from the densified dielectric layer 140' towards the fin structures 120.

In some embodiments, the inert dopant includes Ar, Ta, N, C, another inert material, or a combination thereof. In some embodiments, the type of the dopants in the densified dielectric layer 140' is examined using a suitable electron microscope. For example, the type of the dopants may be examined using a scanning electron microscope (SEM) and energy-dispersive X-ray (EDX) analysis technique.

In some embodiments, the densification process 150 further includes an annealing process that is subsequently performed after the doping process. In some embodiments, the annealing process is a rapid thermal annealing (RTA) process. Embodiments of the disclosure are not limited thereto. In some other embodiments, no annealing process is performed over the densified dielectric layer 140'.

Some surface portions of the dielectric layer 140 are modified during the densification process 150. As a result, a densified region 160 is formed within the densified dielectric layer 140' after the densification process 150, as shown in FIG. 1C in accordance with some embodiments. The boundary of the densified region 160 is shown by dotted lines in figures. The dotted lines are drawn to provide a better understanding of the structure. The densified region 160 may not have an actual boundary.

In some embodiments, the densification process 150 includes a doping process, and the densified region 160 is referred to as a doped region. The densified region 160 extends from the top surface 140T into the densified dielectric layer 140'. The position (or depth) of the densified region 160 within the densified dielectric layer 140' may be controlled by tuning the process parameters of the densification process 150. For example, the implantation energy and/or dosage may be varied to control the position of the densified region 160. In some embodiments, the depth of the densified region 160 within the densified dielectric layer 140' is in a range from about 1 nm to about 3 nm.

In some embodiments, the densification process 150 is fine-tuned so that the depth of the densified region 160 within the densified dielectric layer 140' is less than the thickness $T_1$ of the densified dielectric layer 140'. As a result, the densified region 160 is separated from the fin structures 120 and the semiconductor substrate 100.

Many variations and/or modifications can be made to embodiments of the disclosure. In some other embodiments, the densification process 150 is fine-tuned so that the depth of the densified region 160 within the densified dielectric layer 140' is substantially the same as the thickness $T_1$ of the densified dielectric layer 140'. As a result, the densified region 160 is in direct contact with the top surface 120T and the sidewalls 120S of the fin structures 120 and the semiconductor substrate 100.

In some embodiments, the densified region 160 extends along the top surface 120T and the sidewalls 120S of the fin structures 120 and the bottom surface 110B of the recesses 110. However, embodiments of the disclosure are not limited thereto. In some other embodiments, the densified region 160 extends along the top surface 120T and the sidewalls 120S without extending along the bottom surface 110B. The sidewalls 120S may be partially surrounded by the densified region 160.

In some embodiments, the crystal lattice of the densified region 160 of the densified dielectric layer 140' is different from that of the dielectric layer 140. In other words, the crystal lattice of some surface portions of the dielectric layer 140 is changed during the densification process 150. In some embodiments, the crystal lattice change is examined using a suitable electron microscope. For example, the crystal lattice change may be examined using a transmission electron microscope (TEM) and X-ray diffraction (XRD) analysis technique.

Figure 1D:
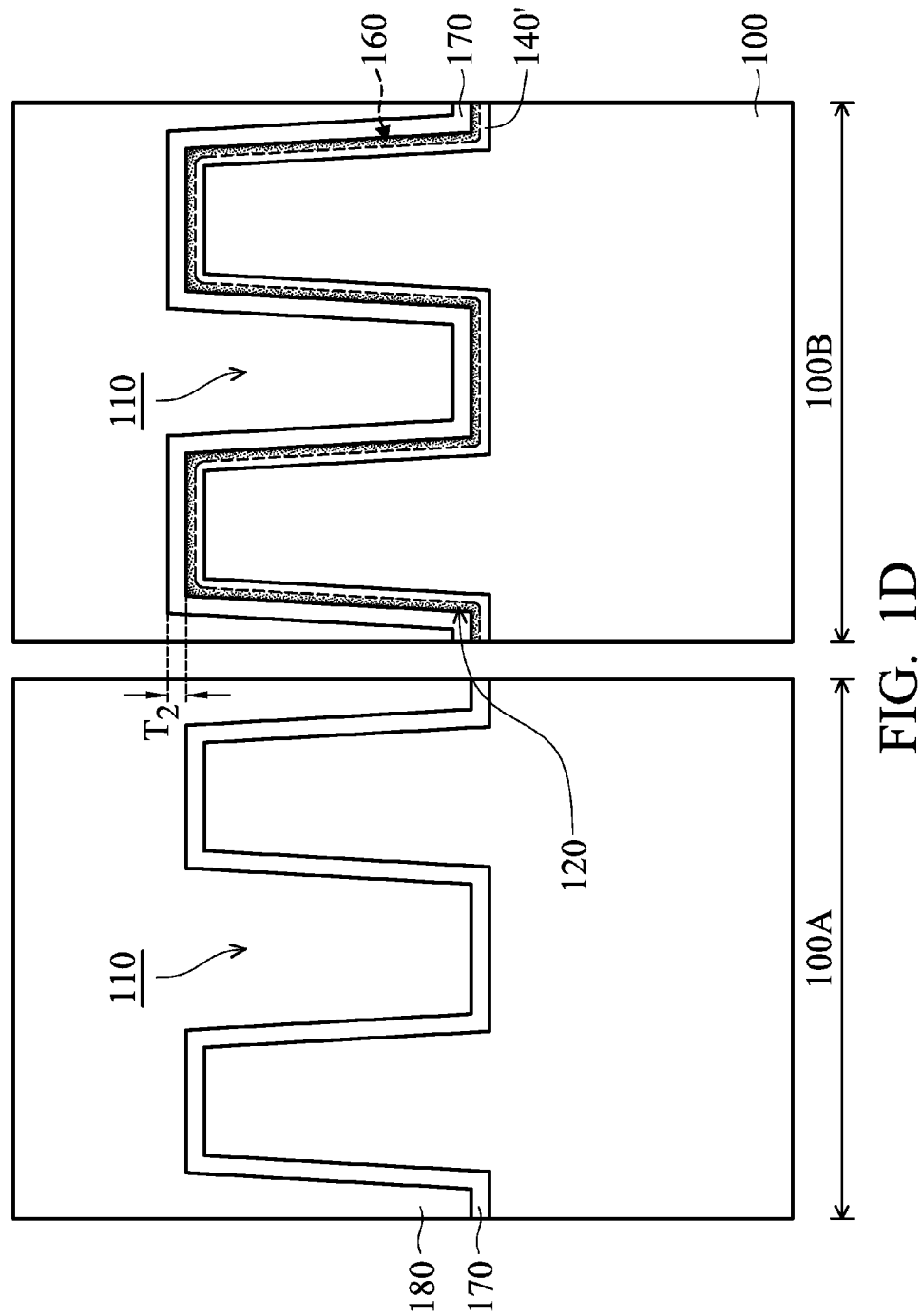

As shown in FIG. 1D, a dielectric layer 170 is deposited over the semiconductor substrate 100 and the fin structures 120, in accordance with some embodiments. In some embodiments, the dielectric layer 170 covers the fin structures 120 in the regions 100A and 100B. In some embodiments, the dielectric layer 170 conformally extends over the top surface 120T and the sidewalls 120S of the fin structures 120 in the regions 100A and 100B. In some embodiments, the densified dielectric layer 140' in the region 100B is covered by the dielectric layer 170. In some embodiments, the dielectric layer 170 is in direct contact with the densified region 160.

In some embodiments, the thickness $T_2$ of the dielectric layer 170 is in a range from about 1 nm to about 3 nm. In some embodiments, the thickness $T_2$ is substantially the same as the thickness $T_1$ of the densified dielectric layer 140'.

In some embodiments, an N-type FinFET is configured to be formed in the region 100A, and the dielectric layer 170 includes a material containing a P-type dopant. The P-type dopant is boron (B), gallium (Ga) or another suitable dopant. For example, the dielectric layer 170 includes B doped silicon glass, such as borosilicate glass (BSG), or another suitable material. In some embodiments, the material of the dielectric layer 170 is different from that of the densified dielectric layer 140'.

In some embodiments, the dielectric layer 170 is deposited using a CVD process, an ALD process, a thermal oxidation process, a PVD process, another applicable process, or a combination thereof.

As shown in FIG. 1D, an isolation layer 180 is deposited over dielectric layer 170 in the regions 100A and 100B, in accordance with some embodiments. The isolation layer 180 covers the fin structures 120 and fills the recesses 110 between the fin structures 120.

In some embodiments, the isolation layer 180 includes silicon oxide, silicon nitride, silicon oxynitride, fluoride-doped silicate glass (FSG), low-K dielectric material, another suitable material, or a combination thereof. In some embodiments, the isolation layer 180 is deposited using a CVD process, a spin-on process, another applicable process, or a combination thereof.

Figure 1E:
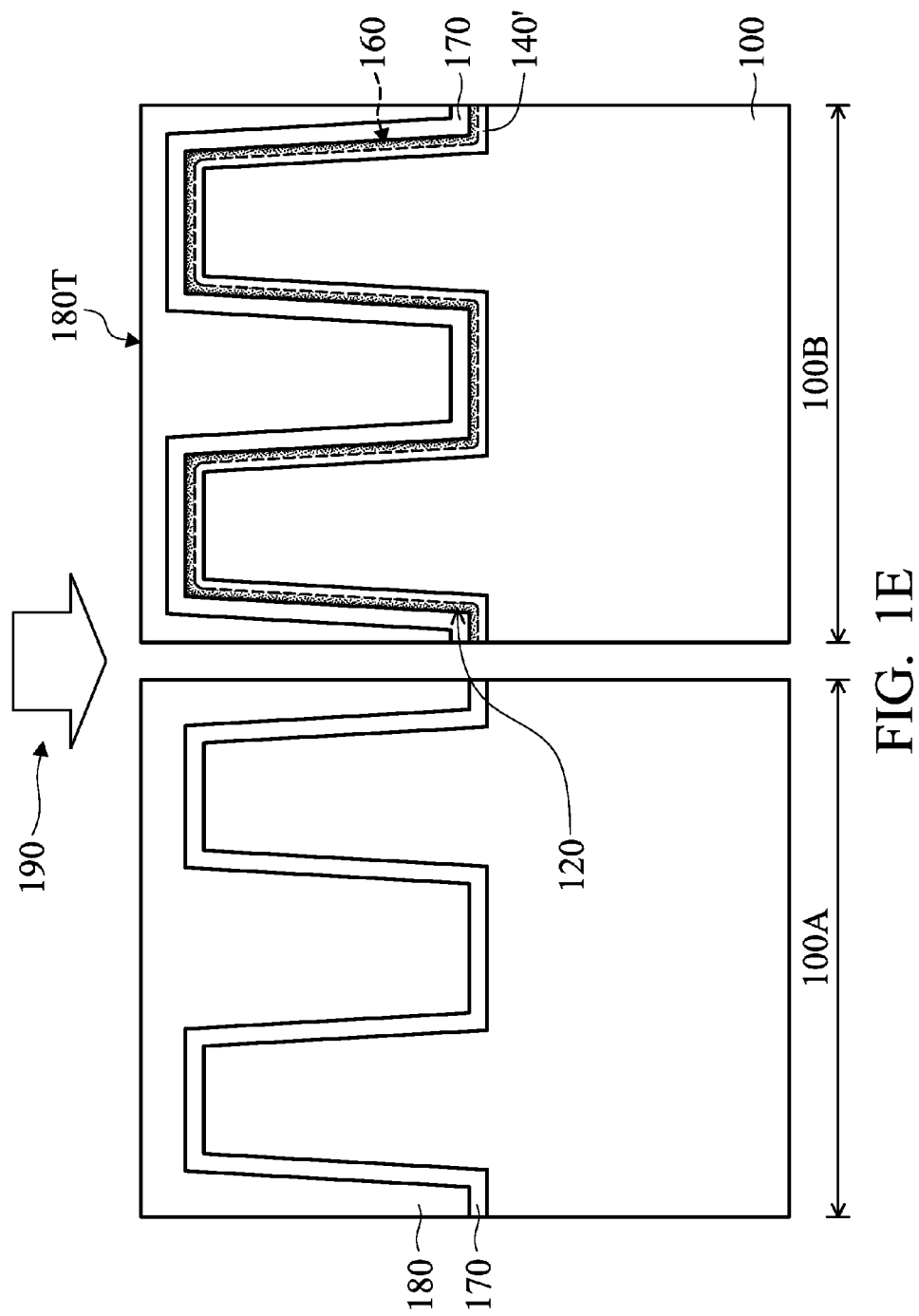

As shown in FIG. 1E, a planarization process 190 is performed to thin the isolation layer 180 in the regions 100A and 100B, in accordance with some embodiments. As a result, the top surface 180T of the isolation layer 180 may be substantially flat. In some embodiments, the dielectric layer 170 in the region 100B remains covered by the isolation layer 180 after the planarization process 190. Embodiments of the disclosure are not limited thereto. The isolation layer 180 may be thinned until the dielectric layer 170 in the region 100B is exposed.

In some embodiments, the planarization process 190 includes a chemical mechanical polishing (CMP) process, a grinding process, another applicable process, or a combination thereof.

Figure 1F:
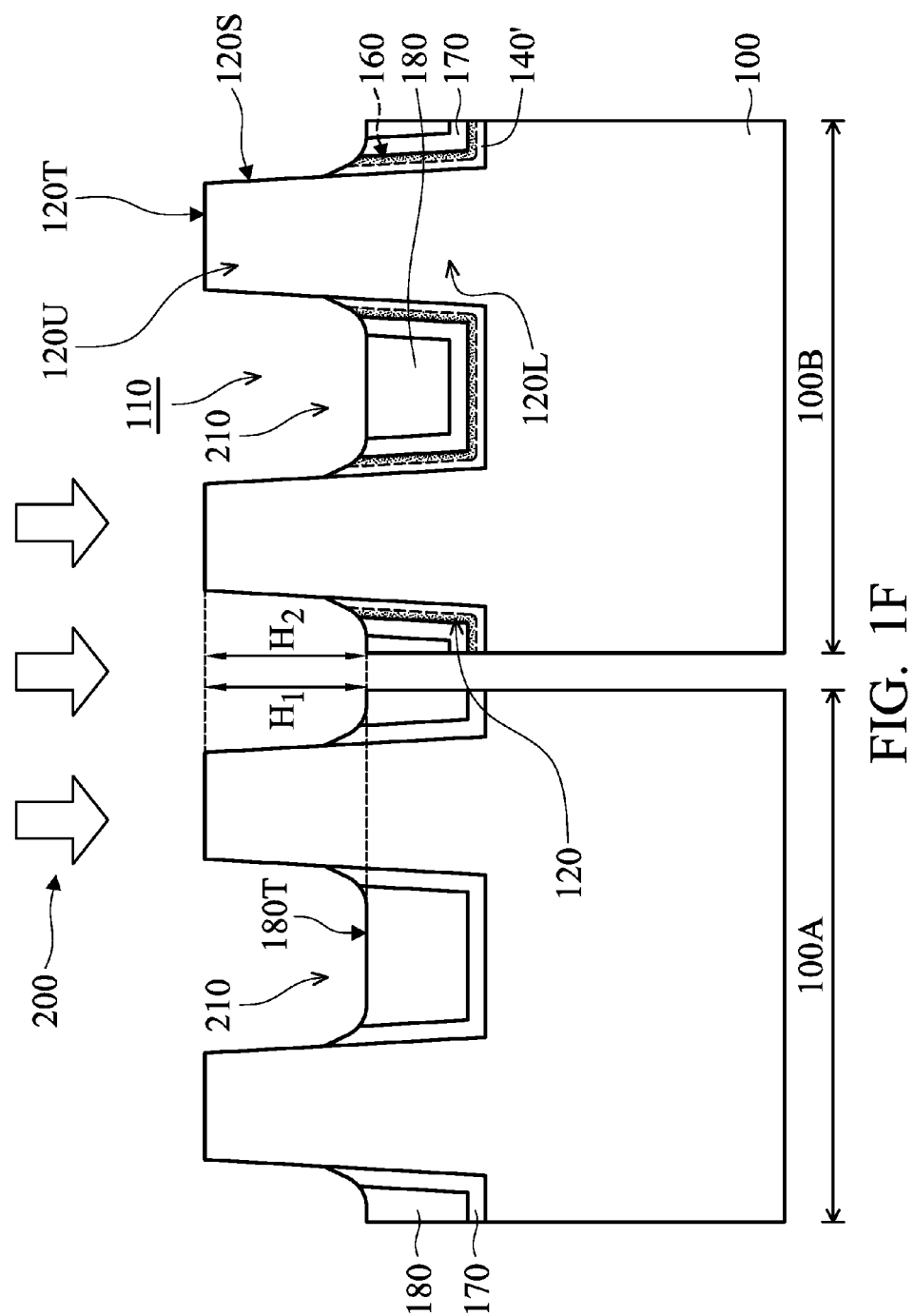

As shown in FIG. 1F, an etching process 200 is performed over the thinned isolation layer 180 in the regions 100A and 100B, in accordance with some embodiments. As a result, the thinned isolation layer 180 is etched back to form the isolation features 210 in the recesses 110 between the fin structures 120. The isolation features 210 are used to define and electrically isolate various device elements formed in and/or over the semiconductor substrate 100.

In some embodiments, the isolation features 210 include shallow trench isolation (STI) features, local oxidation of silicon (LOCOS) features, another suitable isolation feature, or a combination thereof. Each of the isolation features 210 may have a multi-layer structure.

In some embodiments, the isolation features 210 surround a lower portion 120L of the fin structures 120. An upper portion 120U of the fin structures 120 protrudes from the isolation features 210. In some embodiments, the upper portion 120U in the region 100A has a height $H_1$ in a range from about 20 nm to about 80 nm. For example, the height $H_1$ may be in a range from about 30 nm to about 60 nm. In some embodiments, the upper portion 120U in the region 100B has a height $H_2$ in a range from about 20 nm to about 80 nm. For example, the height $H_2$ may be in a range from about 30 nm to about 60 nm. The heights $H_1$ and $H_2$ may be measured from the top surface 120T of the fin structures 120 to the top surface 180T of the isolation layer 180.

In some embodiments, the height $H_1$ is substantially the same as the height $H_2$. Many variations and/or modifications can be made to embodiments of the disclosure. In some other embodiments, the height $H_2$ is greater than the height $H_1$. In some other embodiments, the ratio of the height $H_2$ to the height $H_1$ is in a range from about 1 to about 3.

As shown in FIG. 1F, the densified dielectric layer 140' with the densified region 160 and the dielectric layer 170 are partially removed during the etching process 200, in accordance with some embodiments. As a result, the top surface 120T and the sidewalls 120S of the upper portion 120U of the fin structures 120 in the regions 100A and 100B are exposed.

In some embodiments, the densified region 160 partially remains in the recesses 110 after the etching process 200. In some embodiments, the sidewalls 120S of the fin structures 120 are covered and surrounded by the remaining densified region 160. The bottom surface 110B of the recesses 110 may also be covered by the remaining densified region 160. In some embodiments, the remaining densified region 160 extends between the isolation features 210 and the semiconductor substrate 100.

However, embodiments of the disclosure are not limited thereto. In some other embodiments, the densified region 160 is removed from the recesses 110.

In accordance with some embodiments, the etching process 200 uses an etchant having high etching selectivity of the isolation layer 180 to the fin structures 120. The isolation layer 180 is etched much faster than the fin structures 120. As a result, the top surface 180T of the isolation layer 180 is lower than the top surface 120T of the fin structures 120. In some embodiments, the etchant has low etching selectivity of the dielectric layer 170 to the densified dielectric layer 140'. The etching rates of the densified dielectric layer 140' and the dielectric layer 170 may be substantially the same. In some embodiments, the etchant includes HF and $NH_3$ or another suitable etchant.

In accordance with some embodiments, the dielectric layer 140 contains an N-type dopant, such as phosphorus. The dielectric layer 140 is modified during the densification process 150. As a result, the concentration of the densified dielectric layer 140' is prevented from being reduced before the etching process 200. In some embodiments, the densified dielectric layer 140' has the densified region 160 after the densification process 150. The densified region 160 prevents the N-type dopant in the densified dielectric layer 140' from being dissolved in a solution containing water. For example, the solution containing water may be used during one or more wet processes before the deposition of the dielectric layer 170 and/or the etching process 200.

Since the densified region 160 constrains the concentration of the densified dielectric layer 140', the densified dielectric layer 140' maintains substantially the same concentration after the densification process 150 and before the etching process 200. As a result, the etching rate of the densified dielectric layer 140' in the etching process 200 is not increased and varied. In some embodiments, the concentration of the densified dielectric layer 140' is not shifted and is substantially uniform. As a result, the etching rate of the densified dielectric layer 140' in the etching process 200 is also substantially uniform. Therefore, this can ensure that the height of the upper portion 120U of the fin structures 120 protruding from the isolation features 210 is accurately controlled.

For example, multiple fin structures 120 have a substantially uniform height of the upper portion 120U. In some embodiments, the height $H_1$ of the upper portion 120U in the region 100A is substantially the same as the height $H_2$ of the upper portion 120U in the region 100B. However, embodiments of the disclosure are not limited thereto. The height $H_2$ may be precisely controlled to be greater than the height $H_1$.

The etching rate of the densified dielectric layer 140' may be controlled by fine-tuning the process parameters of the densification process 150. For example, the implantation energy, depth and/or dosage may be varied to control the etching rate of the densified dielectric layer 140'. In some embodiments, the implantation dosage is increased to reduce the variation of the etching rate of the densified dielectric layer 140'. Therefore, this can ensure that the height of the upper portion 120U of the fin structures 120 is desirable.

Figure 1G:
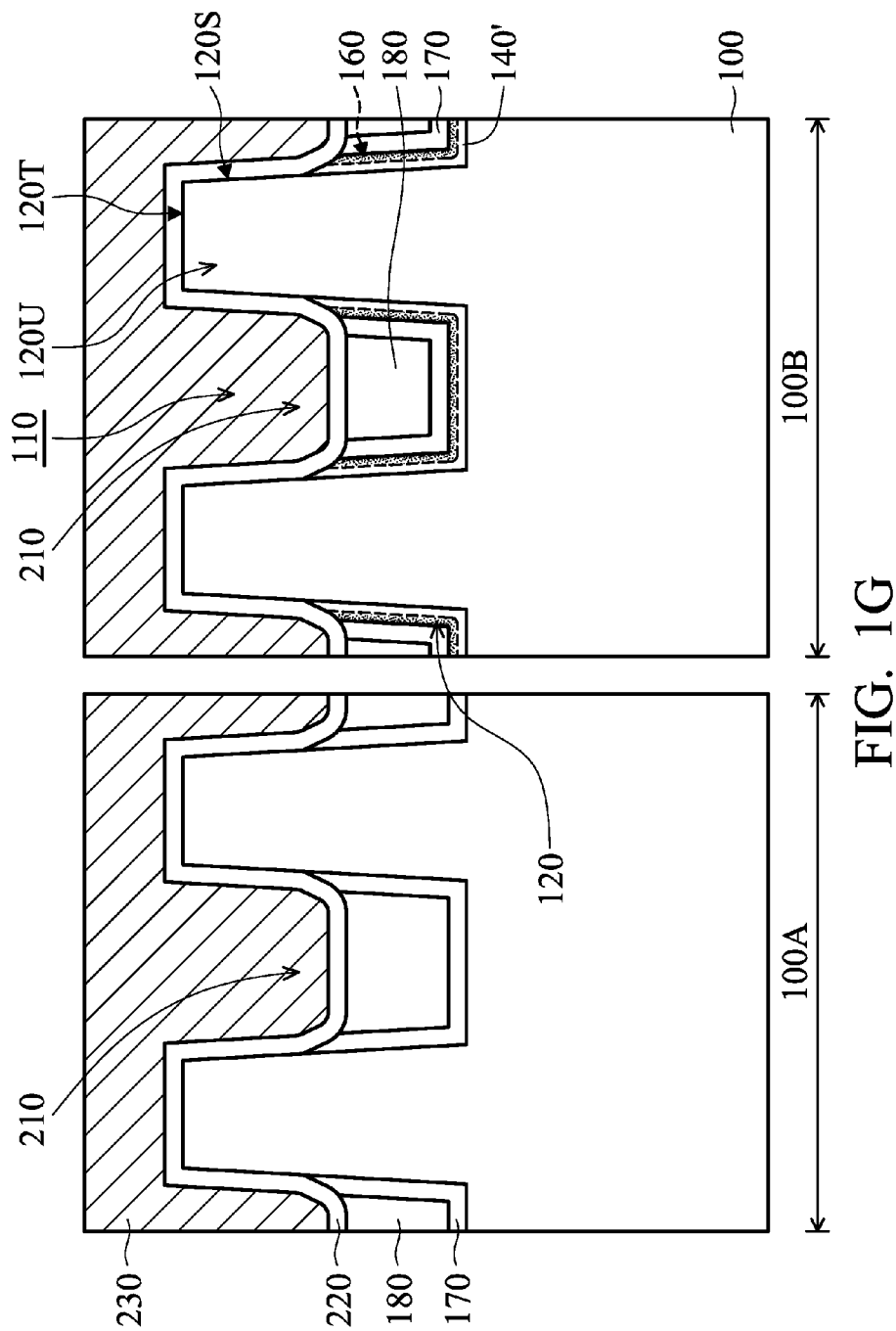

Afterwards, gate stacks are formed over the upper portion 120U of the fin structures 120 in the regions 100A and 100B, in accordance with some embodiments. In some embodiments, each of the gate stacks includes a gate dielectric layer 220 and a gate electrode 230, as shown in FIG. 1G. In some embodiments, the gate dielectric layer 220 conformally extends over the top surface 120T and the sidewalls 120S of the fin structures 120 and the isolation features 210. In some embodiments, the gate dielectric layer 220 is in direct contact with the densified region 160 remaining in the recesses 110.

In some embodiments, the gate dielectric layer 220 is made of silicon oxide, silicon nitride, silicon oxynitride, dielectric material with high dielectric constant (high-K), another suitable dielectric material, or a combination thereof. In some embodiments, the gate dielectric layer 220 is a dummy gate dielectric layer which will be removed in a subsequent gate replacement process. The dummy gate dielectric layer is, for example, a silicon oxide layer.

In some embodiments, the gate electrode 230 covers the gate dielectric layer 220 and fills the recesses 110. In some embodiments, the gate electrode 230 includes polysilicon, a metal material, another suitable conductive material, or a combination thereof. In some embodiments, the gate electrode 230 is a dummy gate electrode and will be replaced with another conductive material, such as a metal material. The dummy gate electrode layer is made of, for example, polysilicon.

In some embodiments, each of the gate stacks further includes a hard mask (not shown) over the gate electrode 230. The hard mask may serve as an etching mask during the formation of the gate electrode. The hard mask may also protect the gate electrode 230 during subsequent processes. In some embodiments, the hard mask is made of silicon nitride, silicon oxynitride, silicon carbide, silicon oxide, silicon carbon nitride, another suitable material, or a combination thereof.

Many variations and/or modifications can be made to embodiments of the disclosure. In some other embodiments, an interfacial layer (not shown) is deposited over the semiconductor substrate 100 in the regions 100A and 100B after the etching process 200. The interfacial layer is used to form a high-quality interface with a low-density of defects and create a barrier against interfacial reactions and/or diffusion between the gate dielectric layer 220 and the fin structures 120.

In some embodiments, the interfacial layer covers the densified region 160, the isolation features 210 and the upper portion 120U of the fin structures 120. In some embodiments, the interfacial layer is in direct contact with the densified region 160 remaining in the recesses 110. In some embodiments, the interfacial layer includes silicon oxide or another suitable material. In some embodiments, the interfacial layer is deposited using a CVD process, an ALD process, another applicable process, or a combination thereof.

Subsequently, various features will be formed in the fin structures 120 or over the semiconductor substrate 100. Some of the various features are electrically connected to the gate electrode 230 of the gate stacks. The various features may include source/drain features, interconnection features and another suitable feature. Therefore, one or more FinFETs are fabricated. The FinFETs include an N-type FinFET in the region 100A and a P-type FinFET in the region 100B.

Embodiments of the disclosure can be applied to not only a semiconductor device structure with complementary FinFETs but also a semiconductor device structure with P-type FinFETs. In some embodiments, the materials and/or formation methods of a semiconductor device structure with P-type FinFETs are similar to those of the described semiconductor device structure with complementary FinFETs.

Embodiments of the disclosure form a semiconductor device structure with a fin structure. A dielectric layer containing an N-type dopant, such as phosphorus, is deposited over the fin structure. Afterwards, a densification process, such as a doping process, is performed over the dielectric layer. As a result, a densified or doped dielectric layer is formed. The N-type dopant in the densified dielectric layer is prevented from being dissolved in a solution, which is used in a subsequent process. Accordingly, the concentration of the densified dielectric layer is successfully fixed. An isolation layer is subsequently deposited over the densified dielectric layer and surrounds upper and lower portions of the fin structure. Afterwards, the densified dielectric layer and the isolation layer are partially etched. As a result, an isolation feature surrounding the lower portion of the fin structure is formed. The upper portion of the fin structure protrudes from the isolation feature. Due to the stabilized concentration of the densified dielectric layer, the etching rate of the densified dielectric layer is not changed and is substantially uniform. Accordingly, the height of the upper portion of the fin structure protruding from the isolation feature is well controlled. Therefore, the performance and reliability of the semiconductor device structure are enhanced significantly.

In accordance with some embodiments, a method for forming a semiconductor device structure is provided. The method includes forming a first fin structure and a second fin structure over a semiconductor substrate. Each of the first fin structure and the second fin structure has an upper portion and a lower portion. The method also includes forming a phosphosilicate glass (PSG) layer surrounding the upper portion and the lower portion of the first fin structure. The method further includes doping the PSG layer to form a doped PSG layer. In addition, the method includes forming a borosilicate glass (BSG) layer surrounding the upper portion and the lower portion of the second fin structure. The BSG layer extends over the doped PSG layer. The method also includes forming an isolation layer over the BSG layer. The method further includes partially etching the isolation layer, the BSG layer and the doped PSG layer to expose the upper portion of the first fin structure and the upper portion of the second fin structure.

In accordance with some embodiments, a method for forming a semiconductor device structure is provided. The method includes forming a fin structure over a semiconductor substrate. The fin structure has an upper portion and a lower portion. The method also includes forming a dielectric layer comprising an N-type dopant. The dielectric layer surrounds the upper portion and the lower portion of the fin structure. The method further includes changing a crystal lattice of the dielectric layer to form a densified region within the dielectric layer. The densified region surrounds the upper portion and the lower portion of the fin structure. In addition, the method includes forming an isolation layer over the dielectric layer with the densified region. The upper portion and the lower portion of the fin structure are embedded in the isolation layer. The method also includes performing an etching process to remove the dielectric layer with the densified region and the isolation layer over the upper portion of the fin structure.

In accordance with some embodiments, a semiconductor device structure is provided. The semiconductor device structure includes a fin structure over a semiconductor substrate. The fin structure has an upper portion and a lower portion. The semiconductor device structure also includes an isolation feature surrounding the lower portion of the fin structure. The upper portion of the fin structure protrudes from a top surface of the isolation feature. The semiconductor device structure further includes a doped layer between the isolation feature and the lower portion of the fin structure. The doped layer is made of silicate glass containing an N-type dopant. The doped layer comprises an inert dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first fin structure and a second fin structure over a semiconductor substrate, wherein each of the first fin structure and the second fin structure has an upper portion and a lower portion;
    forming a phosphosilicate glass (PSG) layer surrounding the upper portion and the lower portion of the first fin structure;
    doping the PSG layer to form a doped PSG layer;
    forming a borosilicate glass (BSG) layer surrounding the upper portion and the lower portion of the second fin structure, wherein the BSG layer extends over the doped PSG layer;
    forming an isolation layer over the BSG layer; and
    partially etching the isolation layer, the BSG layer and the doped PSG layer to expose the upper portion of the first fin structure and the upper portion of the second fin structure.

2. The method for forming a semiconductor device structure as claimed in claim 1, wherein the doped PSG layer comprises an inert dopant.

3. The method for forming a semiconductor device structure as claimed in claim 2, wherein the inert dopant comprises Ar, Ta, N, C or a combination thereof.

4. The method for forming a semiconductor device structure as claimed in claim 1, wherein the doped PSG layer and the PSG layer have different crystal lattices.

5. The method for forming a semiconductor device structure as claimed in claim 1, further comprising annealing the doped PSG layer.

6. The method for forming a semiconductor device structure as claimed in claim 1, further comprising polishing the isolation layer over the doped PSG layer before partially etching the isolation layer.

7. The method for forming a semiconductor device structure as claimed in claim 1, wherein the isolation layer, the BSG layer and the doped PSG layer are partially etched by HF or $NH_3$.

8. A method for forming a semiconductor device structure, comprising:
    forming a fin structure over a semiconductor substrate, wherein the fin structure has an upper portion and a lower portion;
    forming a dielectric layer comprising an N-type dopant, wherein the dielectric layer surrounds the upper portion and the lower portion of the fin structure;
    changing a crystal lattice of the dielectric layer to form a densified region within the dielectric layer, wherein the densified region surrounds the upper portion and the lower portion of the fin structure;
    forming an isolation layer over the dielectric layer with the densified region, wherein the upper portion and the lower portion of the fin structure are embedded in the isolation layer; and
    performing an etching process to remove the dielectric layer with the densified region and the isolation layer over the upper portion of the fin structure.

9. The method for forming a semiconductor device structure as claimed in claim 8, wherein the crystal lattice of the dielectric layer is changed by performing an implantation process.

10. The method for forming a semiconductor device structure as claimed in claim 9, wherein the densified region is implanted with an inert dopant.

11. The method for forming a semiconductor device structure as claimed in claim 10, wherein the inert dopant comprises Ar, Ta, N, C or a combination thereof.

12. The method for forming a semiconductor device structure as claimed in claim 9, further comprising annealing the densified region after the implantation process.

13. The method for forming a semiconductor device structure as claimed in claim 8, wherein the lower portion of the fin structure is surrounded by the densified region after the etching process.

14. The method for forming a semiconductor device structure as claimed in claim 13, further comprising forming a gate stack over the upper portion of the fin structure after the etching process, wherein the gate stack covers the densified region.

15. A method for forming a semiconductor device structure, comprising:
    forming a first fin structure over a semiconductor substrate;
    depositing a first silicate glass layer containing an N-type dopant to surround the first fin structure;
    doping an inert dopant in the first silicate glass layer after the deposition of the first silicate glass layer;
    depositing an isolation layer to surround the first fin structure after the doping of the inert dopant;
    etching the isolation layer and the first silicate glass layer doped with the inert dopant to expose the first fin structure;
    depositing a gate dielectric layer to cover the exposed first fin structure and the isolation layer; and
    depositing a gate electrode covering the gate dielectric layer.

16. The method for forming a semiconductor device structure as claimed in claim 15, wherein the first silicate glass layer extends between the isolation layer and the first fin structure and between the isolation layer and the semiconductor substrate, and wherein the gate dielectric layer adjoins a remaining portion of the first silicate glass layer doped with the inert dopant.

17. The method for forming a semiconductor device structure as claimed in claim 15, further comprising annealing the first silicate glass layer after the doping of the inert dopant and before the deposition of the isolation layer.

18. The method for forming a semiconductor device structure as claimed in claim 15, further comprising forming a planarization process to thin the isolation layer, wherein the first fin structure remains covered by the first silicate glass layer doped with the inert dopant during the planarization process.

19. The method for forming a semiconductor device structure as claimed in claim 15, further comprising forming a second silicate glass layer containing a P-type dopant, wherein the second silicate glass layer is sandwiched between the first silicate glass layer doped with the inert dopant and the isolation layer.

20. The method for forming a semiconductor device structure as claimed in claim 15, further comprising forming a second fin structure over the semiconductor substrate, wherein the second fin structure is exposed after the deposition of the first silicate glass layer, and wherein the doping of the inert dopant comprises performing an implantation process over the first silicate glass layer and the exposed second fin structure.

\* \* \* \* \*